(12) United States Patent
Cabanillas (10) Patent No.: US 8,149,050 B2
(45) Date of Patent: Apr. 3, 2012

(54) CASCADED AMPLIFIERS WITH TRANSFORMER-BASED BYPASS MODE

(75) Inventor: Jose Cabanillas, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 12/783,448

(22) Filed: May 19, 2010

(65) Prior Publication Data

US 2011/0115565 A1 May 19, 2011

Related U.S. Application Data

(60) Provisional application No. 61/261,223, filed on Nov. 13, 2009.

(51) Int. Cl.
*H03F 1/14* (2006.01)
(52) U.S. Cl. .................... 330/51; 330/310; 330/302
(58) Field of Classification Search ........... 330/51, 330/310, 98, 133, 150, 151, 154
See application file for complete search history.

(56) References Cited

U.S. PATENT DOCUMENTS

| | | | | |
|---|---|---|---|---|
| 6,069,526 A * | 5/2000 | Ballantyne | ................. | 330/51 |
| 6,603,359 B2 * | 8/2003 | Fujiwara et al. | ................. | 330/310 |
| 7,479,827 B2 * | 1/2009 | Hau et al. | ................. | 330/51 |
| 7,944,291 B2 * | 5/2011 | Jung et al. | ................. | 330/51 |
| 2006/0261887 A1 | 11/2006 | Kim et al. | | |
| 2009/0174515 A1 | 7/2009 | Lee et al. | | |

FOREIGN PATENT DOCUMENTS

| | | |
|---|---|---|
| DE | 10259338 A1 | 7/2004 |
| DE | 10361660 A1 | 2/2005 |
| WO | WO0062420 A1 | 10/2000 |

OTHER PUBLICATIONS

International Search Report and Written Opinion—PCT/US2010/056616—ISA/EPO—Apr. 15, 2011.

* cited by examiner

*Primary Examiner* — Hieu Nguyen
(74) *Attorney, Agent, or Firm* — Ramin Mobarhan (57) ABSTRACT

Cascaded amplifiers with a transformer-based bypass mode are described. In an exemplary design, an apparatus includes first and second amplifiers and a circuit. The first amplifier (e.g., a driver amplifier) provides amplification in a high gain mode and a bypass mode. The second amplifier (e.g., a power amplifier) provides amplification in the high gain mode. The circuit is coupled between the first and second amplifiers and includes a transformer having (i) a primary coil coupled to the first amplifier and (ii) a secondary coil that provides an output signal in the bypass mode. The primary coil may be a load inductor for the first amplifier. The circuit may further include a series combination of a capacitor and a switch coupled in parallel with the primary coil, a switch coupled in series with the secondary coil, and/or a capacitor coupled in parallel with the secondary coil.

25 Claims, 8 Drawing Sheets

CASCADED AMPLIFIERS WITH TRANSFORMER-BASED BYPASS MODE

CLAIM OF PRIORITY UNDER 35 U.S.C. §119

The present Application for Patent claims priority to Provisional U.S. Application Ser. No. 61/261,223, entitled "DIFFERENTIAL MID-GAIN MODE IMPLEMENTATION (PA BYPASS) FOR RF CASCADED AMPLIFIERS," filed Nov. 13, 2009, assigned to the assignee hereof, and expressly incorporated herein by reference.

BACKGROUND

I. Field

The present disclosure relates generally to electronics, and more specifically to amplifiers.

II. Background

Amplifiers are commonly used in various electronic devices to provide signal amplification. Different types of amplifiers are available for different uses. For example, a wireless communication device such as a cellular phone may include a transmitter and a receiver for bi-directional communication. The transmitter may include a driver amplifier (DA) and a power amplifier (PA), the receiver may include a low noise amplifier (LNA), and the transmitter and receiver may include variable gain amplifiers (VGAs).

A transmitter may have an amplifier module that may include multiple amplifiers, e.g., a driver amplifier and a power amplifier. The amplifier module may support multiple operating modes. Each operating mode may correspond to a different output power level, a different overall gain, etc. It may be desirable to implement the amplifier module such that good performance can be achieved for all operating modes while reducing circuit area and cost.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Various exemplary designs of cascaded amplifiers with multiple operating modes are described herein. The cascaded amplifiers may be used in various electronic devices such as wireless communication devices, cellular phones, personal digital assistants (PDAs), handheld devices, wireless modems, laptop computers, cordless phones, Bluetooth devices, consumer electronic devices, etc. For clarity, the use of the cascaded amplifiers in a wireless communication device is described below.

Figure 1:
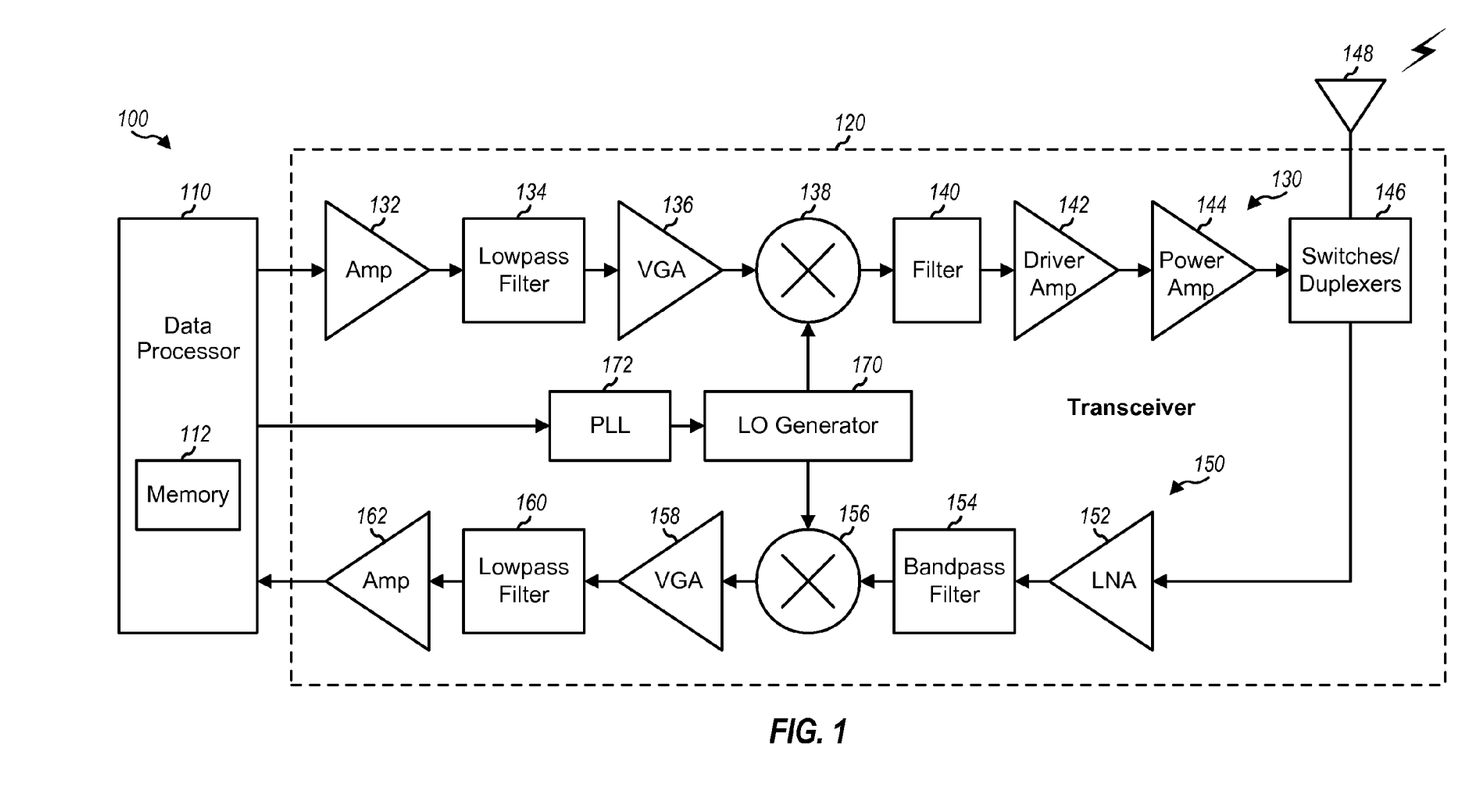
FIG. 1 shows a block diagram of a wireless communication device.

FIG. 1 shows a block diagram of an exemplary design of a wireless communication device 100. In this exemplary design, wireless device 100 includes a data processor 110 and a transceiver 120. Transceiver 120 includes a transmitter 130 and a receiver 150 that support bi-directional wireless communication. In general, wireless device 100 may include any number of transmitters and any number of receivers for any number of communication systems and any number of frequency bands.

In the transmit path, data processor 110 processes data to be transmitted and provides an analog output signal to transmitter 130. Within transmitter 130, the analog output signal is amplified by an amplifier (Amp) 132, filtered by a lowpass filter 134 to remove images caused by digital-to-analog conversion, amplified by a VGA 136, and upconverted from baseband to radio frequency (RF) by a mixer 138. The upconverted signal is filtered by a filter 140, further amplified by a driver amplifier 142 and a power amplifier 144, routed through switches/duplexers 146, and transmitted via an antenna 148.

In the receive path, antenna 148 receives signals from base stations and/or other transmitter stations and provides a received signal, which is routed through switches/duplexers 146 and provided to receiver 150. Within receiver 150, the received signal is amplified by an LNA 152, filtered by a bandpass filter 154, and downconverted from RF to baseband by a mixer 156. The downconverted signal is amplified by a VGA 158, filtered by a lowpass filter 160, and amplified by an amplifier 162 to obtain an analog input signal, which is provided to data processor 110.

FIG. 1 shows transmitter 130 and receiver 150 implementing a direct-conversion architecture, which frequency converts a signal between RF and baseband in one stage. Transmitter 130 and/or receiver 150 may also implement a superheterodyne architecture, which frequency converts a signal between RF and baseband in multiple stages. A local oscillator (LO) generator 170 generates and provides transmit and receive LO signals to mixers 138 and 156, respectively. A phase locked loop (PLL) 172 receives control information from data processor 110 and provides control signals to LO generator 170 to generate the transmit and receive LO signals at the proper frequencies.

FIG. 1 shows an exemplary transceiver design. In general, the conditioning of the signals in transmitter 130 and receiver 150 may be performed by one or more stages of amplifier, filter, mixer, etc. These circuits may be arranged differently from the configuration shown in FIG. 1. Furthermore, other circuits not shown in FIG. 1 may also be used in the transmitter and receiver. For example, matching circuits may be used to match various active circuits in FIG. 1. Some circuits in FIG. 1 may also be omitted. Transceiver 120 may be implemented on one or more analog integrated circuits (ICs), RF ICs (RFICs), mixed-signal ICs, etc. For example, amplifier 132 through power amplifier 144 in transmitter 130 may be implemented on an RFIC. Driver amplifier 142 and power amplifier 144 may also be implemented on another IC external to the RFIC.

Data processor 110 may perform various functions for wireless device 100, e.g., processing for transmitted and received data. A memory 112 may store program codes and data for data processor 110. Data processor 110 may be implemented on one or more application specific integrated circuits (ASICs) and/or other ICs.

As shown in FIG. 1, a transmitter and a receiver may include various amplifiers. Each amplifier at RF may have input impedance matching and output impedance matching, which are not shown in FIG. 1 for simplicity.

In FIG. 1, driver amplifier 142 and power amplifier 144 may be implemented in a PA module. The PA module may support multiple operating modes, which may be associated with different output power levels, different gains, etc. The operating modes may also be referred to as gain modes, etc. For example, the PA module may support the following operating modes:

1. High gain mode—driver amplifier 142 and power amplifier 144 are both enabled,
2. Medium gain mode—only driver amplifier 142 is enabled, and power amplifier 144 is disabled, and
3. Low gain mode—driver amplifier 142 and power amplifier 144 are both disabled.

The high, medium and low gain modes may also be referred to as high power mode, PA bypass mode, and full bypass mode, respectively. The low and medium gain modes may be referred to as bypass modes. The PA module may also support more or fewer operating modes. In any case, the multiple operating modes may allow the output power of the PA module to be adjusted in response to changes in link/environment conditions. Finer gain steps may be achieved by varying the gain of driver amplifier 142 and/or the gain of power amplifier 144.

It may be desirable to implement the bypass modes to achieve the following objectives:

1. Minimize impact to the performance of the high gain mode, and
2. Minimize area used to implement circuits for the bypass modes.

The bypass modes are typically implemented with switches, which may be located in a high power signal path for the high gain mode and/or may load sensitive nodes of the high power signal path. This may lead to reduced efficiency of the high gain mode. The first objective may be achieved by implementing the switches for the bypass modes such that the high power signal path is minimally affected.

The high gain mode may be implemented with a set of circuits, and the bypass modes may be implemented with one or more additional sets of circuits. Each set of circuits may be designed to obtain good performance for the associated operating mode(s). This may provide good performance for the bypass modes with minimal impact to the performance of the high gain mode. However, additional circuit area would be used to implement the additional set(s) of circuits for the bypass modes and may result in higher cost.

In an aspect, for a PA module comprising a driver amplifier and a power amplifier coupled in cascade (or series), a bypass mode may be implemented by reusing an inductor at the output of the driver amplifier for a transformer. The inductor may be used as a load inductor for the driver amplifier and/or an inductor for output impedance matching in the high gain mode. The inductor may be reused as a primary coil of the transformer in the bypass mode. The transformer would include a secondary coil that may be used for the bypass mode. The transformer may be implemented with little additional circuit area, which may achieve the second objective above. A signal path for the bypass mode may be implemented such that the performance of the high gain mode may be minimally impacted, which may then achieve the first objective above.

Figure 2:
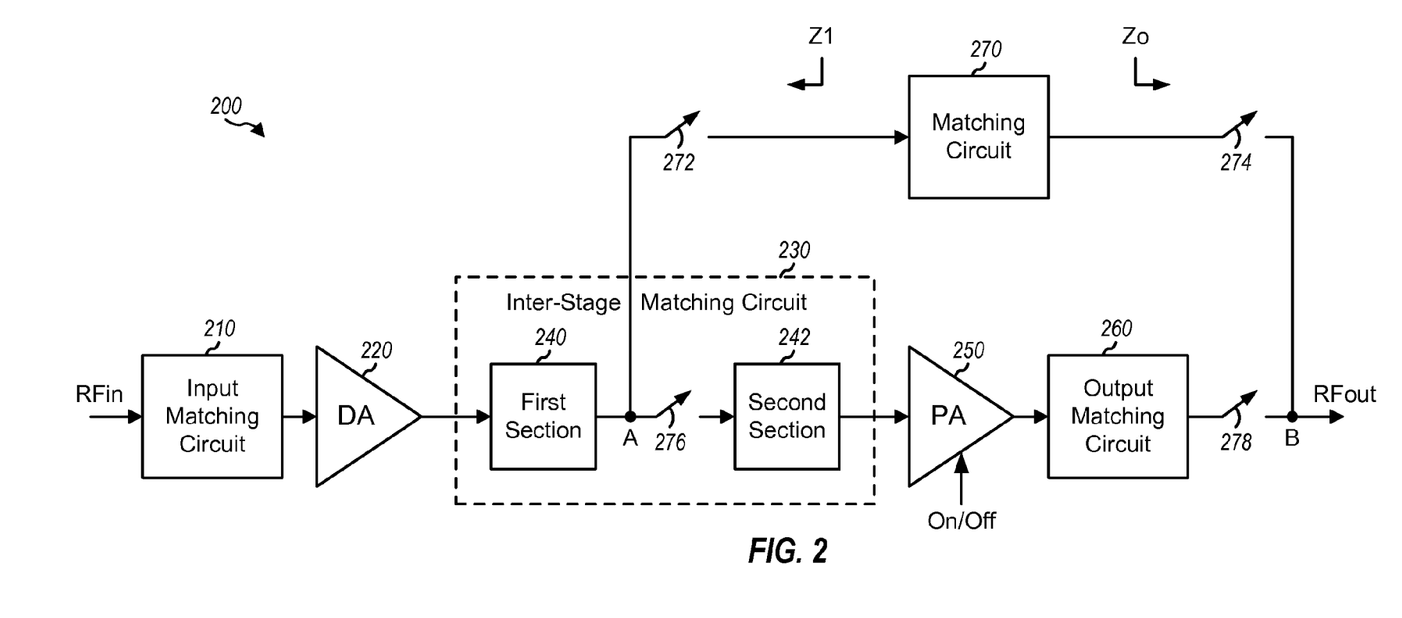
FIG. 2 shows a block diagram of a PA module with multiple operating modes.

FIG. 2 shows a block diagram of an exemplary design of a PA module 200 with multiple operating modes. PA module 200 may be used for driver amplifier 142 and power amplifier 144 in FIG. 1. Within PA module 200, an input matching circuit 210 receives an input RF signal (RFin) and has its output coupled to the input of a driver amplifier 220. The output of driver amplifier 220 is coupled to an inter-stage matching circuit 230, which includes a first section 240, a switch 276, and a second section 242 coupled in series. First section 240 is coupled between the input of matching circuit 230 and node A. Switch 276 and second section 242 are coupled in series, and the combination is coupled between node A and the output of matching circuit 230.

A power amplifier 250 has its input coupled to the output of inter-stage matching circuit 230 and its output coupled to the input of an output matching circuit 260. Power amplifier 250 may be enabled or disabled based on an On/Off control. A switch 278 has one end coupled to the output of matching circuit 260 and the other end coupled to node B, which provides an output RF signal (RFout). A switch 272 has one end coupled to node A and the other end coupled to the input of a matching circuit 270. A switch 274 has one end coupled to node B and the other end coupled to the output of matching circuit 270. Although not shown in FIG. 2, the RFout signal may be provided to a duplexer, an antenna, an RF switch, and/or other circuits.

PA module 200 supports a high gain mode and a bypass mode. In the high gain mode, switches 276 and 278 are closed, switches 272 and 274 are opened, and driver amplifier 220 and power amplifier 250 are both enabled. Amplifiers 220 and 250 provide signal amplification and high output power for the RFout signal. Matching circuit 210 performs input impedance matching for driver amplifier 220. Matching circuit 230 performs impedance matching between the output of driver amplifier 220 and the input of power amplifier 250. Matching circuit 260 performs output impedance matching for power amplifier 250 and may match a low output impedance of power amplifier 250 to a target output impedance of Zo, which may be 50 Ohms or some other value.

In the bypass mode, switches 276 and 278 are opened, switches 272 and 274 are closed, driver amplifier 220 is enabled, and power amplifier 250 is disabled. Driver amplifier 220 provides signal amplification and low to medium output power for the RFout signal. An amplified signal from driver amplifier 220 is routed through first section 240 and matching circuit 270 and provided as the RFout signal. First section 240 and matching circuit 270 perform output impedance matching for driver amplifier 220 in the bypass mode. Matching circuit 270 may match an impedance of Z1 at node A to the target output impedance of Zo.

In general, a PA module may support any number of operating modes. Each operating mode may be associated with a specific set of zero or more amplifiers that is enabled. For example, PA module 200 may include a full bypass mode in which driver amplifier 220 and power amplifier 250 are both disabled.

Figure 3:
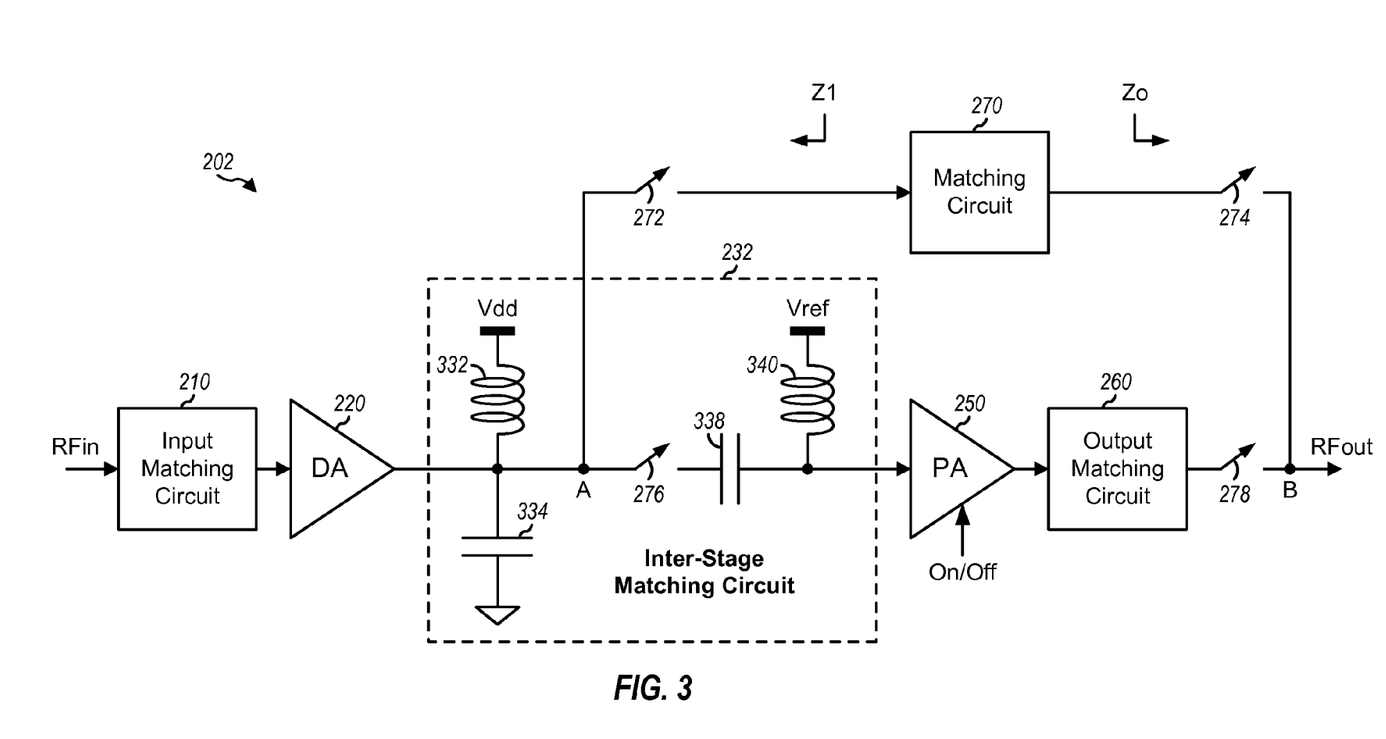
FIG. 3 shows a schematic diagram of a single-ended PA module.

FIG. 3 shows a schematic diagram of a single-ended PA module 202, which is an exemplary design of PA module 200 in FIG. 2. PA module 202 includes all circuit blocks in FIG. 2 with the following difference. Matching circuit 230 in FIG. 2 is implemented with a matching circuit 232 in FIG. 3.

Within matching circuit 232, an inductor 332 has one end coupled to node A and the other end coupled to a power supply (Vdd). Inductor 332 may be a load inductor for driver amplifier 220. A capacitor 334 is coupled between node A and circuit ground. A capacitor 338 is coupled between switch 276 and the input of power amplifier 250. An inductor 340 is coupled between the input of power amplifier 250 and a reference voltage (Vref). Inductor 332 and capacitor 334 form the first section of matching circuit 232. Capacitor 338 and inductor 340 form the second section of matching circuit 232.

FIG. 3 shows an exemplary design of matching circuit 232. In general, a matching circuit may be implemented with any number of sections/stages, any number of inductors and capacitors, and any order. More sections may result in less sensitivity to circuit component variations and may also provide a broader frequency response, both of which may be desirable. A matching circuit may also be implemented with various circuit topologies such as shunt inductor (L) and shunt capacitor (C), series C and shunt L, series L and shunt C, etc.

Although not shown in FIG. 3, matching circuits 210, 260 and 270 may each be implemented with one or more inductors and one or more capacitors, which may be arranged based on any circuit topology.

Figure 4:
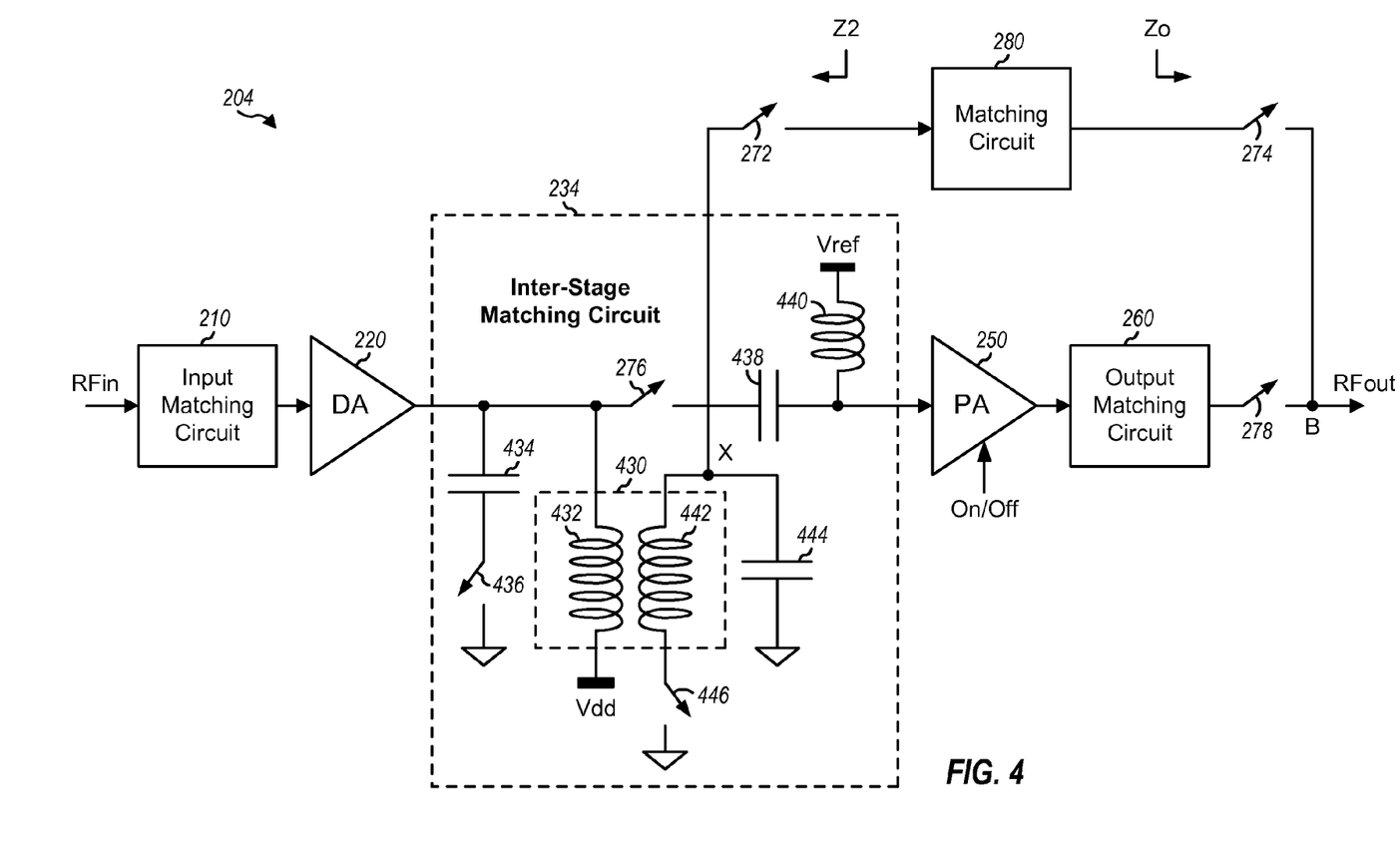
FIG. 4 shows a schematic diagram of a single-ended PA module with a transformer-based bypass mode.

FIG. 4 shows a schematic diagram of an exemplary design of a single-ended PA module 204 with a transformer-based bypass mode. PA module 204 includes all of the circuit blocks in FIG. 2 with the following differences. First, matching circuit 230 in FIG. 2 is implemented with a matching circuit 234 in FIG. 4. Second, matching circuit 270 in FIG. 2 is replaced with a matching circuit 280 in FIG. 4.

Within matching circuit 234, a capacitor 434 and a switch 436 are coupled in series, and the combination is coupled between the output of driver amplifier 220 and circuit ground. A transformer 430 includes a primary coil 432 and a secondary coil 442. The terms "coil", "inductor", and "conductor" may be used interchangeably. Primary coil 432 is coupled between the output of driver amplifier 220 and Vdd. Secondary coil 442 is coupled in series with a switch 446, and the combination is coupled between node X and circuit ground. A capacitor 444 is coupled between node X and circuit ground. Switch 276 and a capacitor 438 are coupled in series, and the combination is coupled between the output of driver amplifier 220 and the input of power amplifier 250. An inductor 440 is coupled between the input of power amplifier 250 and Vref.

In the high gain mode, switches 276 and 278 are closed, switches 272, 274 and 446 are opened, and driver amplifier 220 and power amplifier 250 are both enabled. Secondary coil 442 is disconnected and floats. Primary coil 432, inductor 440, and capacitor 438 perform inter-stage impedance matching. Switch 436 may also be closed, and capacitor 434 may be coupled in parallel with primary coil 432 to vary the inter-stage impedance matching, e.g., to obtain a flatter frequency response, higher output power, improved power-added efficiency (PAE), etc.

In the bypass mode, switches 276 and 278 are opened, switches 272, 274 and 446 are closed, driver amplifier 220 is enabled, and power amplifier 250 is disabled. Node X at the secondary side of transformer 430 is coupled to matching circuit 280 via switch 272. Transformer 430 performs impedance matching from the low output impedance of driver amplifier 220 to a particular impedance, which may be the target output impedance of Zo or some other impedance. Switch 436 may be closed, and capacitor 434 may be coupled in parallel with primary coil 432 and used to vary the impedance matching. Capacitor 434 may be a programmable capacitor that may have different values in the bypass mode and the high gain mode. Capacitor 444 may be used to obtain the desired impedance matching.

Node X may have an impedance of Z2 in the bypass mode, which may be designed to be close to the target output impedance of Zo. In this case, matching circuit 280 may be omitted. Matching circuit 280 may also be used to perform impedance matching between the nominal impedance of Z2 at node X to the target output impedance of Zo in the bypass mode.

As shown in FIG. 4, transformer 430 may be used to support the bypass mode and may reuse a load inductor of driver amplifier 220 as primary coil 432. Switch 446 may be coupled in series with secondary coil 442 of transformer 430 and may be closed or opened to connect or disconnect transformer 430. Capacitor 444 may be coupled in parallel with secondary coil 442 and used to provide impedance matching in the bypass mode. Switchable capacitor 434 may be coupled in parallel with primary coil 432 and may be used to adjust the impedance matching, e.g., to allow trade-off of inductor size between the bypass mode and the high gain mode. Matching circuit 280 may be used to provide further impedance matching.

Switch 274 may be used to isolate the bypass mode from the high gain mode and to reduce parasitic loading at node B. The impedance at node B where switch 274 is connected may be relatively high, e.g., between 25 to 50 Ohms. Hence, switch 274 may have minor impact on efficiency in the high gain mode.

The switches may be implemented with metal oxide semiconductor (MOS) transistors. The RFout signal may have a large voltage swing in the high gain mode, and the large voltage swing may exceed a breakdown voltage of each MOS transistor. Improved reliability may be achieved by implementing a switch with multiple MOS transistors coupled in a stack. The large voltage swing of the RFout signal may then be split or distributed approximately equally across the MOS transistors in the stack. Each MOS transistor may then observe only a fraction of the large voltage swing, which should be less than the breakdown voltage of the MOS transistor in order to achieve good reliability. In general, any number of MOS transistors may be coupled in a stack to split the large voltage swing across the MOS transistors in the off state. In an exemplary design, for the bypass mode, switch 274 may include a subset of the MOS transistors in a stack, and switch 272 may include the remaining MOS transistors in the stack. This may reduce loading at node B due to the signal path for the bypass mode, which may reduce performance degradation in the high gain mode.

Figure 5:
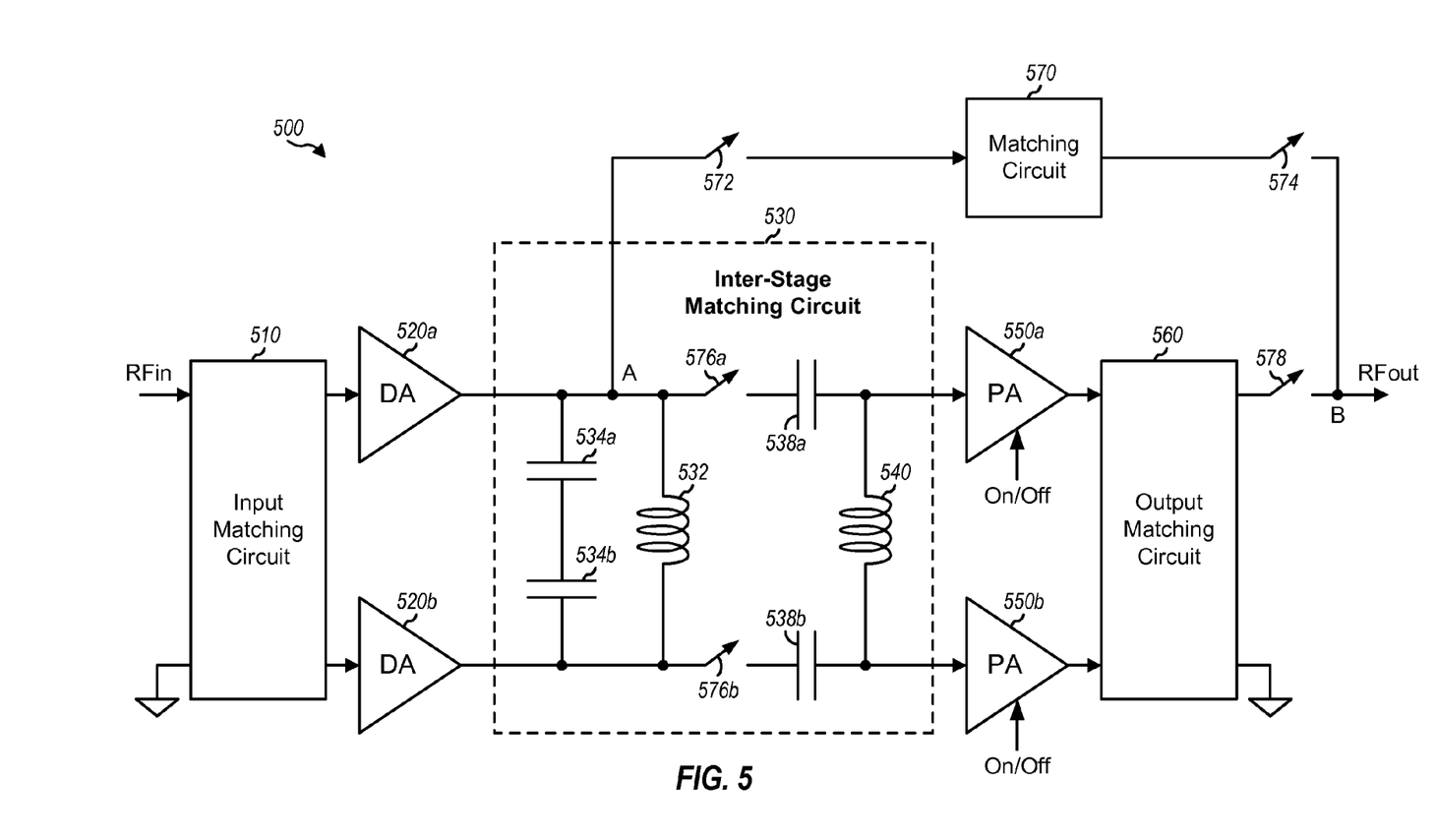
FIG. 5 shows a schematic diagram of a differential PA module.

FIG. 5 shows a schematic diagram of an exemplary design of a differential PA module 500 with multiple operating modes. Within PA module 500, an input matching circuit 510 receives an RFin signal and provides a differential DA input signal. Driver amplifiers 520a and 520b receive and amplify the differential DA input signal and provide a differential DA output signal. An inter-stage matching circuit 530 receives the differential DA output signal and provides a differential PA input signal. Power amplifiers 550a and 550b receive and amplify the differential PA input signal and provide a differential PA output signal. An output matching circuit 560 receives the differential PA output signal and provides a single-ended output signal. A switch 578 has one end coupled to the output of matching circuit 560 and the other end coupled to node B, which provides an RFout signal.

A switches 572 has one end coupled to node A and the other end coupled to the input of a matching circuit 570. A switch 574 has one end coupled to node B and the other end coupled to the output of matching circuit 570. Although not shown in FIG. 5, the RFout signal may be provided to a duplexer, an antenna, an RF switch, and/or other circuits.

FIG. 5 also shows an exemplary design of inter-stage matching circuit 530. Within matching circuit 530, an inductor 532 is coupled between the outputs of driver amplifiers 520a and 520b. Capacitors 534a and 534b are coupled in series, and the combination is coupled between the outputs of driver amplifiers 520a and 520b. A switch 576a and a capacitor 538a are coupled in series, and the combination is coupled between the output of driver amplifier 520a and the input of power amplifier 550a. A switch 576b and a capacitor 538b are coupled in series, and the combination is coupled between the output of driver amplifier 520b and the input of power amplifier 550b. An inductor 540 is coupled between the inputs of power amplifiers 550a and 550b.

PA module 500 supports a high gain mode and a bypass mode. In the high gain mode, switches 576a, 576b and 578 are closed, switches 572 and 574 are opened, and driver amplifiers 520a and 520b and power amplifiers 550a and 550b are all enabled. Amplifiers 520a, 520b, 550a and 550b provide signal amplification and high output power for the RFout signal. Matching circuit 510 performs single-ended to differential conversion and input impedance matching for driver amplifiers 520a and 520b. Matching circuit 530 performs impedance matching between the outputs of driver amplifiers 520a and 520b and the inputs of power amplifiers 550a and 550b. Matching circuit 560 performs output impedance matching for power amplifiers 550a and 550b and differential to single-ended conversion.

In the bypass mode, switches 576a, 576b and 578 are opened, switches 572 and 574 are closed, driver amplifiers 520a and 520b are enabled, and power amplifiers 550a and 550b are disabled. Driver amplifiers 520a and 520b provide signal amplification and low to medium output power for the RFout signal. An output signal from driver amplifier 520a is routed through matching circuit 570 and provided as the RFout signal. The first section of matching circuit 530 and matching circuit 570 perform output impedance matching for driver amplifier 520a.

Figure 6:
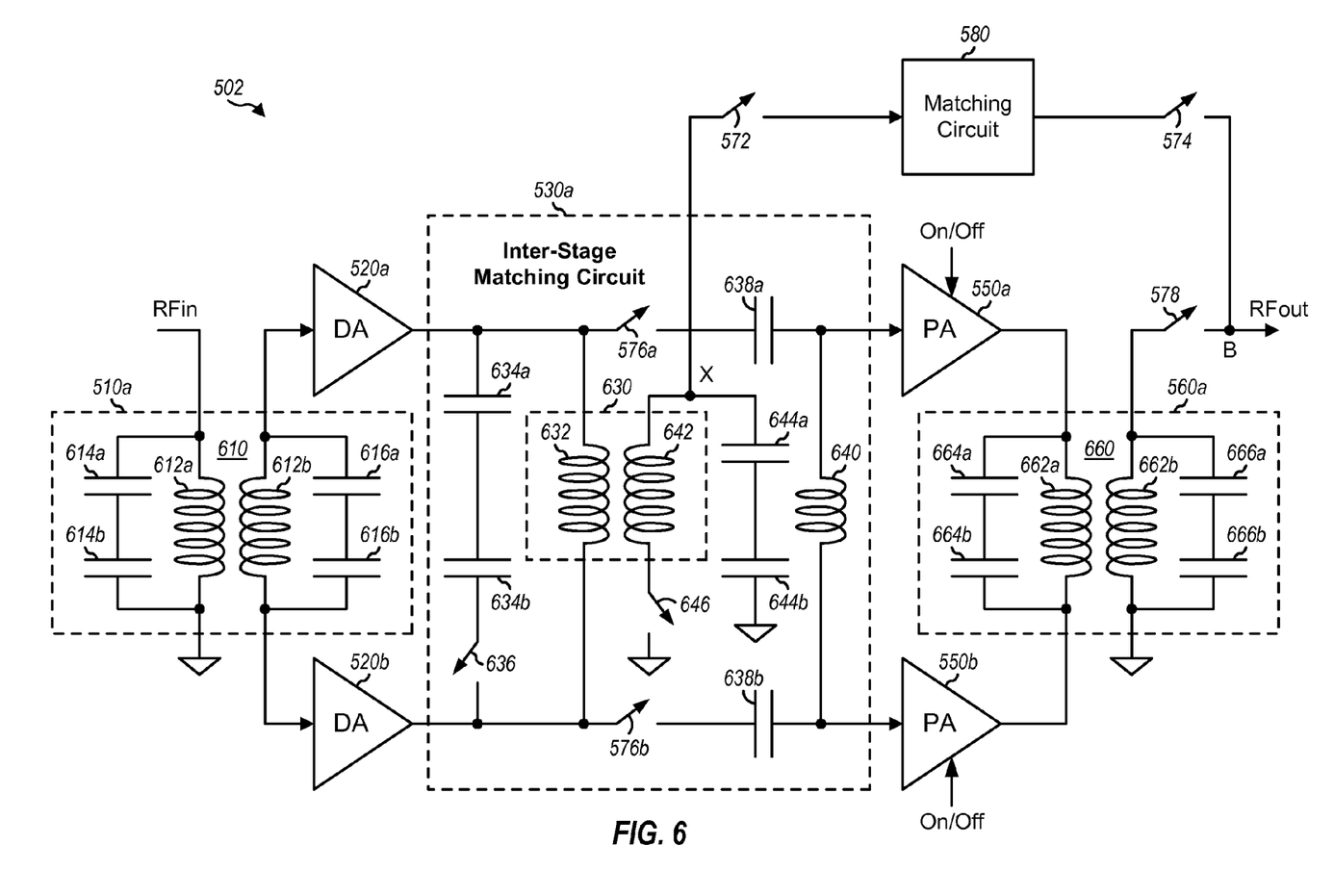
FIG. 6 shows a schematic diagram of a differential PA module with a transformer-based bypass mode.

FIG. 6 shows a schematic diagram of an exemplary design of a differential PA module 502 with a transformer-based bypass mode. PA module 502 includes all of the circuit blocks in FIG. 5 with the following differences. Input matching circuit 510 in FIG. 5 is implemented with an input matching circuit 510a in FIG. 6. Inter-stage matching circuit 530 in FIG. 5 is replaced with an inter-stage matching circuit 530a in FIG. 6. Output matching circuit 560 in FIG. 5 is implemented with an output matching circuit 560a in FIG. 6. Matching circuit 570 in FIG. 5 is replaced with a matching circuit 580 in FIG. 6.

Within input matching circuit 510a, a transformer 610 includes a primary coil 612a and a secondary coil 612b. Primary coil 612a has one end receiving the RFin signal and the other end coupled to circuit ground. Capacitors 614a and 614b are coupled in series, and the combination is coupled in parallel with primary coil 612a. Capacitors 616a and 616b are coupled in series, and the combination is coupled in parallel with secondary coil 612b. The two ends of secondary coil 612b are coupled to the inputs of driver amplifiers 520a and 520b.

Within inter-stage matching circuit 530a, capacitors 634a and 634b and a switch 636 are coupled in series, and the combination is coupled between the outputs of driver amplifiers 520a and 520b. A transformer 630 includes a primary coil 632 and a secondary coil 642. Primary coil 632 is coupled between the outputs of driver amplifiers 520a and 520b. Secondary coil 642 is coupled in series with a switch 646, and the combination is coupled between node X and circuit ground. Capacitors 644a and 644b are in series, and the combination is coupled between node X and circuit ground. Switch 576a and a capacitor 638a are coupled in series, and the combination is coupled between the output of driver amplifier 520a and the input of power amplifier 550a. Switch 576b and a capacitor 638b are coupled in series, and the combination is coupled between the output of driver amplifier 520b and the input of power amplifier 550b. An inductor 640 is coupled between the inputs of power amplifiers 550a and 550b.

Within output matching circuit 560a, a transformer 660 includes a primary coil 662a and a secondary coil 662b. Primary coil 662a is coupled between the outputs of power amplifiers 550a and 550b. Capacitors 664a and 664b are coupled in series, and the combination is coupled in parallel with primary coil 662a. Secondary coil 662b has one end providing a single-ended output signal and the other end coupled to circuit ground. Capacitors 666a and 666b are coupled in series, and the combination is coupled in parallel with secondary coil 662b.

Matching circuit 510a performs single-ended to differential conversion and also performs input impedance matching for driver amplifiers 520a and 520b. Matching circuit 530a performs impedance matching between the outputs of driver amplifiers 520a and 520b and the inputs of power amplifiers 550a and 550b. Matching circuit 560a performs differential to single-ended conversion and also performs output impedance matching for power amplifiers 550a and 550b.

In the high gain mode, switches 576a, 576b and 578 are closed, switches 572, 574 and 646 are opened, and driver amplifiers 520a and 520b and power amplifiers 550a and 550b are all enabled. Secondary coil 642 is disconnected and floats. Primary coil 632, inductor 640, and capacitors 638a and 638b perform inter-stage impedance matching. Switch 636 may also be closed, and capacitor 634a and 634b may be coupled in parallel with primary coil 632 and used to vary the inter-stage impedance matching, e.g., to obtain a flat frequency response, higher output power, improved PAE, etc.

In the bypass mode, switches 576a, 576b and 578 are opened, switches 572, 574 and 646 are closed, driver amplifiers 520a and 520b are enabled, and power amplifiers 550a and 550b are disabled. Node X on the secondary side of transformer 630 is coupled to matching circuit 580 via switch 572. Transformer 630 performs impedance matching from the low output impedance of driver amplifiers 520a and 520b to a particular impedance, which may be the target output impedance of Zo. Switch 636 may be closed, and capacitors 634a and 634b may be coupled in parallel with primary coil 632a and used to vary the impedance matching. Capacitors 634a and 634b may be programmable capacitors that may have different values in the bypass mode and the high gain mode. Capacitors 644a and 644b may be used to obtain the desired impedance matching.

Node X may have an impedance of Z2 in the bypass mode, which may be designed to be close to the target output impedance of Zo. In this case, matching circuit 580 may be omitted. Matching circuit 580 may also be used to perform impedance matching between the nominal impedance of Z2 at node X to the target output impedance of Zo in the bypass mode.

FIGS. 4 and 6 show exemplary single-ended and differential designs of PA modules with transformer-based bypass mode. In general, any number of amplifiers may be coupled in cascade or series. A transformer may be coupled between any two or more amplifiers and used to support a bypass mode. The transformer may reuse a load inductor of a preceding amplifier as a primary coil. A secondary coil of the transformer may provide an output signal for the bypass mode.

A transformer may be implemented in various manners. The primary and secondary coils of the transformer may be implemented with various patterns to obtain the desired inductance and coupling. The primary and secondary coils may also be fabricated on one or more conductive layers.

Figure 7:
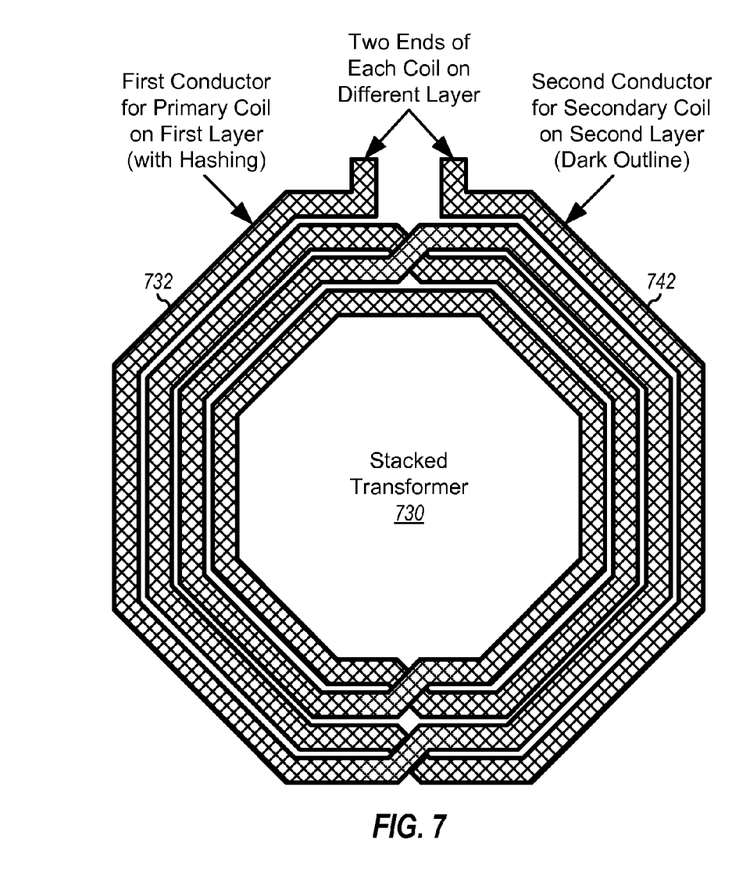
FIGS. 7 and 8 show top views of two exemplary designs of a transformer.

FIG. 7 shows a top view of an exemplary design of a stacked transformer 730, which may be used for transformer 430 in FIG. 4 or transformer 630 in FIG. 6. In this exemplary design, transformer 730 includes a primary coil 732 and a secondary coil 742 fabricated on two conductive layers of an RFIC. Primary coil 732 is implemented with a first conductor arranged in a spiral pattern on a first conductive layer. Secondary coil 742 is implemented with a second conductor arranged in a spiral pattern on a second conductive layer. The second conductor for secondary coil 742 overlaps the first conductor for primary coil 732. Primary coil 732 is shown with cross hashing, and secondary coil 742 is shown with dark outlines in FIG. 7.

Figure 8:
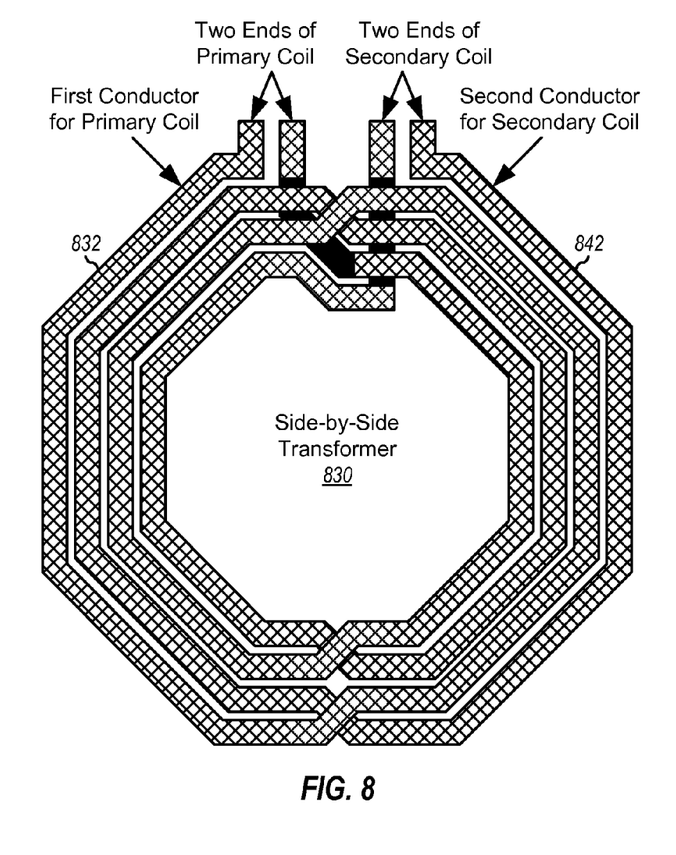

FIG. 8 shows a top view of an exemplary design of a side-by-side transformer 830, which may also be used for transformer 430 in FIG. 4 or transformer 630 in FIG. 6. In this exemplary design, transformer 830 includes a primary coil 832 and a secondary coil 842 fabricated on a single conductive layer of an RFIC. Primary coil 832 is implemented with a first conductor arranged in a spiral pattern on a conductive layer. Secondary coil 842 is implemented with a second conductor arranged in a spiral pattern on the same conductive layer. The second conductor for secondary coil 842 is interlaced or interwoven with the first conductor for primary coil 832, as shown in FIG. 8.

FIGS. 7 and 8 show two exemplary designs of a transformer that may be used to support a transformer-based bypass mode. In general, the primary and secondary coils of the transformer may each be implemented with any number of turns. The secondary coil may have fewer, more, or the same number of turns as the primary coil. The number of turns, the diameter of the turns, the width and height of each conductor, the spacing between the two conductors for the primary and secondary coils, and/or other attributes of the two conductors may be selected to obtain the desired inductance and quality factor (Q) for each coil and the desired coupling coefficient between the two coils. The coupling coefficient may be varied by controlling the placement of the two conductors and/or the distance between the conductors.

FIGS. 7 and 8 show exemplary designs in which the primary and secondary coils are implemented with spiral patterns. The primary and secondary coils may also be implemented in other manners such as with a double spiral, zig-zag, or some other pattern. The primary and secondary coils may also be fabricated with various conductive materials such as a low-loss metal (e.g., copper), a more lossy metal (e.g., aluminum), or some other material. Higher Q may be achieved for a coil fabricated on a low-loss metal layer. A smaller-size coil may be fabricated on a lossy metal layer because different IC design rules may apply.

The stacked topology in FIG. 7 may allow transformer 730 to be fabricated in a smaller area and may also result in better matching between the two ends of the secondary coil for a differential design. The side-by-side topology in FIG. 8 may be used when there is a limited number of metal layers. The side-by-side topology may also provide less capacitance between the primary and secondary coils as compared to the stacked topology. Less capacitance may be desirable in order to achieve a higher self resonance frequency (SRF) of the transformer for high frequency operation. The primary and secondary coils may also be implemented with other topologies on one or more conductive layers. In general, different topologies, layout patterns, and fabrication techniques may provide different advantages for a transformer.

The techniques described herein may be used for single-ended and differential cascaded amplifiers, e.g., as shown in FIGS. 4 and 6. The techniques may provide one or more of the following advantages:

1. Reuse most of the circuitry for a high power signal path (e.g., the driver amplifier, input matching circuit, and inter-stage matching circuit), which may save circuit area and design time,
2. Retain the benefits of a differential design, e.g., for better noise and common mode rejection, etc., and
3. Provide flexibility to obtain good efficiency and performance for the bypass mode via circuit components such as parallel capacitors for the primary coil and/or secondary coil, matching circuits 280 and 580, etc.

The techniques replace a load inductor for the driver amplifier with a transformer, which may result in a small increase in circuit area. This may be especially true in an IC process with a sufficient number of (e.g., three or more) conductive layers to allow the transformer to be implemented with a stacked structure.

In an exemplary design, an apparatus (e.g., a wireless device, a IC, etc.) may comprise a first amplifier, a second amplifier, and a circuit, e.g., as shown in FIG. 4. The first amplifier (e.g., driver amplifier 220) may provide amplification in a high gain mode and a bypass mode. The second amplifier (e.g., power amplifier 250) may provide amplification in the high gain mode and may be disabled in the bypass mode. The circuit (e.g., matching circuit 234) may be coupled between the first and second amplifiers and may comprise a transformer. The transformer (e.g., transformer 430) may comprise (i) a primary coil (e.g., primary coil 432) coupled to the first amplifier and (ii) a secondary coil (e.g., secondary coil 442) that provides an output signal in the bypass mode. The primary coil may be a load inductor for the first amplifier and/or may be part of an impedance matching circuit between the first and second amplifiers.

In an exemplary design, the circuit may further comprise a switch (e.g., switch 446) coupled in series with the secondary coil. The switch may be closed in the bypass mode and may be opened in the high gain mode. In an exemplary design, the circuit may further comprise a first capacitor (e.g., capacitor 434) coupled in series with a switch (e.g., switch 436). The combination of the first capacitor and the switch may be coupled in parallel with the primary coil. In an exemplary design, the circuit may further comprise a second capacitor (e.g., capacitor 444) coupled in parallel with the secondary coil.

In an exemplary design, the apparatus may further comprise an impedance matching circuit (e.g., matching circuit 260) coupled to the second amplifier and used to provide a target output impedance in the high gain mode. The transformer and the first and/or second capacitor may perform output impedance matching for the first amplifier in the bypass mode and may provide the target output impedance in the bypass mode.

In an exemplary differential design, the apparatus may further comprise a third amplifier and a fourth amplifier, e.g., as shown in FIG. 6. The third amplifier may provide amplification in the high gain mode and the bypass mode. The first and third amplifiers (e.g., driver amplifiers 520a and 520b) may receive a first differential input signal and provide a first differential amplified signal. The fourth amplifier may provide amplification in the high gain mode and may be disabled in the bypass mode. The second and fourth amplifiers (e.g., power amplifiers 550*a* and 550*b*) may receive a second differential input signal and provide a second differential amplified signal. The circuit may be further coupled between the third and fourth amplifiers. The circuit may receive the first differential amplified signal and provide the second differential input signal. The primary coil may be coupled between the first and third amplifiers. The transformer may perform differential to single-ended conversion in the bypass mode. The circuit may further comprise at least one capacitor (e.g., capacitors 634*a* and 634*b*) coupled in series with a switch (e.g., switch 636), and the combination may be coupled in parallel with the primary coil. The circuit may further comprise at least one capacitor (e.g., capacitors 644*a* and 644*b*) coupled in parallel with the secondary coil.

In an exemplary design, a switch (e.g., switch 274 in FIG. 4 or switch 574 in FIG. 6) may be coupled between the secondary coil and an output node (e.g., node B). In another exemplary design, a first switch (e.g., switch 272 or 572) may be coupled to the secondary coil. An impedance matching circuit (e.g., matching circuit 280 or 580) may be coupled to the first switch. A second switch (e.g., switch 274 or 574) may be coupled between the impedance matching circuit and the output node. Each of the first and second switches may comprise at least one MOS transistor. A high voltage swing at the output node in the high gain mode may be distributed between the MOS transistors for the first and second switches.

In an exemplary design, the primary coil may be implemented with a first conductor on a first conductive layer, and the secondary coil may be implemented with a second conductor on a second conductive layer, e.g., as shown in FIG. 7. The secondary coil may overlay the first conductor at least partially. In another exemplary design, the primary coil may be implemented with a first conductor on a conductive layer, and the secondary coil may be implemented with a second conductor on the same conductive layer, e.g., as shown in FIG. 8. The second conductor may be located adjacent to the first conductor. The primary and secondary coils may also be implemented in other manners.

In another exemplary design, an integrated circuit (or an apparatus) may comprise a driver amplifier, a power amplifier, and a circuit, e.g., as shown in FIG. 4. The driver amplifier may provide amplification in a high gain mode and a bypass mode. The power amplifier may provide amplification in the high gain mode and may be disabled in the bypass mode. The circuit may be coupled between the driver amplifier and the power amplifier and may comprise a transformer. The transformer may comprise (i) a primary coil coupled to the driver amplifier and (ii) a secondary coil that provides an output signal in the bypass mode.

In an exemplary differential design, the integrated circuit may further comprise a second driver amplifier and a second power amplifier, e.g., as shown in FIG. 6. The second driver amplifier may provide amplification in the high gain mode and the bypass mode. The driver amplifier and the second driver amplifier may receive a first differential input signal and provide a first differential amplified signal. The second power amplifier may provide amplification in the high gain mode and may be disabled in the bypass mode. The power amplifier and the second power amplifier may receive a second differential input signal and provide a second differential amplified signal. The circuit may be further coupled between the second driver amplifier and the second power amplifier. The primary coil may be coupled between the driver amplifier and the second driver amplifier. The transformer may perform differential to single-ended conversion and output impedance matching for the driver amplifiers in the bypass mode.

Figure 9:
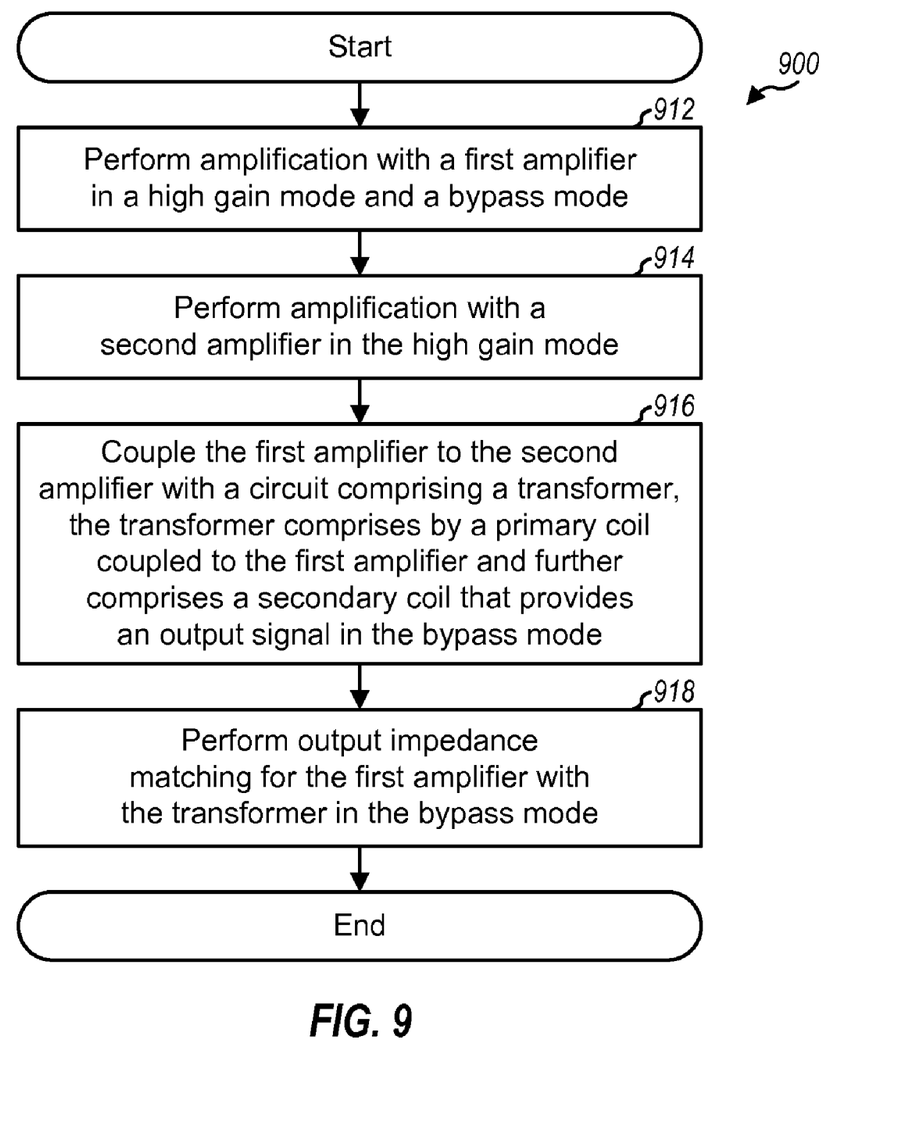
FIG. 9 shows a process for performing signal amplification.

FIG. 9 shows an exemplary design of a process 900 for performing signal amplification. Amplification may be performed with a first amplifier in a high gain mode and a bypass mode (block 912). Amplification may be performed with a second amplifier in the high gain mode (block 914). The first amplifier may be coupled to the second amplifier with a circuit comprising a transformer (block 916). The transformer may comprise (i) a primary coil coupled to the first amplifier and (ii) a secondary coil that provides an output signal in the bypass mode.

The secondary coil may be (i) connected in the bypass mode by closing a switch or (ii) disconnected in the high gain mode by opening the switch. Output impedance matching for the first amplifier may be performed with the transformer and possibly one or more capacitors in the bypass mode (block 918).

In an exemplary differential design, amplification may be performed with a third amplifier in the high gain mode and the bypass mode. The first and third amplifiers may receive a first differential input signal and provide a first differential amplified signal. Amplification may be performed with a fourth amplifier in the high gain mode. The second and fourth amplifiers may receive a second differential input signal and provide a second differential amplified signal. The third amplifier may be coupled to the fourth amplifier with the circuit. The primary coil may be coupled between the first and third amplifiers. The transformer may perform differential to single-ended conversion in the bypass mode.

The cascaded amplifiers described herein may be implemented on an IC, an analog IC, an RFIC, a mixed-signal IC, an ASIC, a printed circuit board (PCB), an electronic device, etc. The cascaded amplifiers may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the cascaded amplifiers described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a first amplifier to provide amplification in a high gain mode and a bypass mode;
   a second amplifier to provide amplification in the high gain mode; and
   a circuit coupled between the first and second amplifiers and comprising a transformer, the transformer comprising a primary coil coupled to the first amplifier and a secondary coil that provides an output signal in the bypass mode.

2. The apparatus of claim 1, the first amplifier comprises a driver amplifier, and the second amplifier comprises a power amplifier.

3. The apparatus of claim 1, the primary coil is a load inductor for the first amplifier, or is part of an impedance matching circuit between the first and second amplifiers, or both.

4. The apparatus of claim 1, the transformer performs output impedance matching for the first amplifier in the bypass mode.

5. The apparatus of claim 1, the circuit further comprises a switch coupled in series with the secondary coil and is closed in the bypass mode and opened in the high gain mode.

6. The apparatus of claim 1, the circuit further comprises a capacitor coupled in series with a switch, the capacitor and the switch are coupled in parallel with the primary coil.

7. The apparatus of claim 1, the circuit further comprises a capacitor coupled in parallel with the secondary coil.

8. The apparatus of claim 7, further comprising:
   an impedance matching circuit coupled to the second amplifier and to provide a target output impedance in the high gain mode, and
   the transformer and the capacitor provide the target output impedance in the bypass mode.

9. The apparatus of claim 1, further comprising:
   a third amplifier to provide amplification in the high gain mode and the bypass mode, the first and third amplifiers receive a first differential input signal and provide a first differential amplified signal; and
   a fourth amplifier to provide amplification in the high gain mode, the second and fourth amplifiers receive a second differential input signal and provide a second differential amplified signal,
   the circuit is further coupled between the third and fourth amplifiers, and the primary coil is coupled between the first and third amplifiers.

10. The apparatus of claim 9, the transformer performs differential to single-ended conversion in the bypass mode.

11. The apparatus of claim 9, the circuit further comprises at least one capacitor coupled in series with a switch, the at least one capacitor and the switch are coupled in parallel with the primary coil.

12. The apparatus of claim 1, further comprising:
    a switch coupled between the secondary coil and an output node.

13. The apparatus of claim 1, further comprising:
    a first switch coupled to the secondary coil;
    an impedance matching circuit coupled to the first switch; and
    a second switch coupled between the impedance matching circuit and an output node.

14. The apparatus of claim 13, each of the first and second switches comprises at least one metal oxide semiconductor (MOS) transistor, and a high voltage swing at the output node in the high gain mode is distributed across MOS transistors in the first and second switches.

15. The apparatus of claim 1, the primary coil is implemented with a first conductor on a first conductive layer, the secondary coil is implemented with a second conductor on a second conductive layer, and the secondary coil overlays the first conductor at least partially.

16. The apparatus of claim 1, the primary coil is implemented with a first conductor on a conductive layer, the secondary coil is implemented with a second conductor on the conductive layer, and the second conductor is located adjacent to the first conductor.

17. An integrated circuit comprising:
    a driver amplifier to provide amplification in a high gain mode and a bypass mode;
    a power amplifier to provide amplification in the high gain mode; and
    a circuit coupled between the driver amplifier and the power amplifier and comprising a transformer, the transformer comprises a primary coil coupled to the driver amplifier and further comprises a secondary coil that provides an output signal in the bypass mode.

18. The integrated circuit of claim 17, further comprising:
    a second driver amplifier to provide amplification in the high gain mode and the bypass mode, the driver amplifier and the second driver amplifier receive a first differential input signal and provide a first differential amplified signal; and
    a second power amplifier to provide amplification in the high gain mode, the power amplifier and the second power amplifier receive a second differential input signal and provide a second differential amplified signal,
    the circuit is further coupled between the second driver amplifier and the second power amplifier, and the primary coil is coupled between the driver amplifier and the second driver amplifier.

19. The integrated circuit of claim 18, the transformer performs differential to single-ended conversion in the bypass mode.

20. A method of performing signal amplification, comprising:
    performing amplification with a first amplifier in a high gain mode and a bypass mode;
    performing amplification with a second amplifier in the high gain mode; and coupling the first amplifier to the second amplifier with a circuit comprising a transformer, the transformer comprises a primary coil coupled to the first amplifier and further comprises a secondary coil that provides an output signal in the bypass mode.

21. The method of claim 20, further comprising:
connecting the secondary coil in the bypass mode by closing a switch; and
disconnecting the secondary coil in the high gain mode by opening the switch.

22. The method of claim 20, further comprising:
performing output impedance matching for the first amplifier with the transformer in the bypass mode.

23. The method of claim 20, further comprising:
performing amplification with a third amplifier in the high gain mode and the bypass mode, the first and third amplifiers receive a first differential input signal and provide a first differential amplified signal;
performing amplification with a fourth amplifier in the high gain mode, the second and fourth amplifiers receive a second differential input signal and provide a second differential amplified signal; and
coupling the third amplifier to the fourth amplifier with the circuit, the primary coil is coupled between the first and third amplifiers.

24. The method of claim 23, further comprising:
performing differential to single-ended conversion with the transformer in the bypass mode.

25. An apparatus comprising:
means for performing amplification in a high gain mode and a bypass mode;
means for performing additional amplification in the high gain mode; and
means for coupling the means for performing amplification to the means for performing additional amplification, the means for coupling comprises transformer means having a primary side coupled to the means for performing amplification and a secondary side that provides an output signal in the bypass mode.

* * * * *